(12) United States Patent
Park

(10) Patent No.: US 7,233,308 B2
(45) Date of Patent: Jun. 19, 2007

(54) SHIFT REGISTER

(75) Inventor: Jae Deok Park, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 555 days.

(21) Appl. No.: 10/747,688

(22) Filed: Dec. 30, 2003

(65) Prior Publication Data
US 2004/0227718 A1 Nov. 18, 2004

(30) Foreign Application Priority Data
May 12, 2003 (KR) .................. 10-2003-0029820

(51) Int. Cl.
*G09G 3/36* (2006.01)
(52) U.S. Cl. .................. 345/100; 345/98; 377/64
(58) Field of Classification Search .................. 345/87, 345/98–100, 204; 377/64
See application file for complete search history.

(56) References Cited

U.S. PATENT DOCUMENTS 5,701,136 A * 12/1997 Huq et al. .................. 345/100
6,339,631 B1 * 1/2002 Yeo et al. .................. 377/64
6,426,743 B1 * 7/2002 Yeo et al. .................. 345/100

\* cited by examiner

*Primary Examiner*—Regina Liang
(74) *Attorney, Agent, or Firm*—McKenna Long & Aldridge LLP

(57) ABSTRACT

A shift register includes stages shifting an input signal with phase-delayed control signals and first and second supply voltages, and for applying shifted input signals as output signals and as input signals of succeeding stages. Each of the stages includes a first controller selectively applying an input signal and a first supply voltage to a first node between first to third transistors; a second controller selectively applying the first and second supply voltages to a second node between fourth and fifth transistors; and an output buffer selectively applying a predetermined control signal and the first supply voltage as an output signal to a stage output line between sixth and seventh transistors, wherein the fifth transistor may be turned on to sustain a voltage present at the second node equal to the first supply voltage when the fourth transistor is turned off.

21 Claims, 12 Drawing Sheets

SHIFT REGISTER

This application claims the benefit of the Korean Patent Application No. 10-2003-0029820 filed on May 12, 2003, which is hereby incorporated by reference for all purposes as if fully set forth herein.

BACKGROUND OF THE INVENTION

1. Field of the Invention

The present invention relates to drive circuits for display devices. More particularly, the present invention relates to a shift register for driving a liquid crystal display device.

2. Description of the Related Art

Generally, liquid crystal display (LCD) devices control light transmittance characteristics of liquid crystal material in accordance with applied electric fields and are used as displays for televisions and computers. Accordingly, LCD devices typically include an LCD panel having a plurality of liquid crystal cells arranged in a matrix pattern, and a drive circuit to drive the plurality of liquid crystal cells.

The liquid crystal display panel generally includes a plurality of gate lines; a plurality of data lines crossing the plurality of gate lines, wherein the liquid crystal cells are arranged at crossings of the gate and data lines; pixel electrodes connected to respective ones of the data lines; and a common electrode, wherein pixel electrodes and common electrode generate the electric field that controls the light transmittance characteristics of the liquid crystal material. Each liquid crystal cell includes a switching device such as a thin film transistor (TFT) having source and drain terminals that connect respective ones of the pixel electrode to corresponding data lines. Further, each TFT includes a gate terminal that is connected to a corresponding gate line.

The drive circuit generally includes a gate driver for driving the gate lines and a data driver for driving the data lines. The gate driver sequentially applies scan signals to the plurality of gate lines to sequentially drive rows of liquid crystal cells. Whenever a scan signal is applied to a gate line, the data driver simultaneously applies video signals to each of the data lines. Accordingly, the video signals applied by the data driver selectively generate electric fields between each pixel electrode and the common electrode. By generating the electric fields, light transmittance characteristics of liquid crystal material within the liquid crystal cells are controlled to display images.

Within the related art drive circuit, the gate driver uses a shift register to sequentially generate the scan signals while the data driver uses sampling signals generated by the shift register to sequentially sample externally inputted video signals. Generally, the gate driver, the data driver, and the shift register are formed out of polycrystalline silicon material and formed integrally onto the liquid crystal display panel with the plurality of liquid crystal cells.

FIG. 1 schematically illustrates a related art shift register. FIG. 2 illustrates input/output waveforms of the related art shift register shown in FIG. 1.

Referring to FIG. 1, the shift register includes "n" number of stages ST1 to STn, wherein the stages are connected in cascade to the input line of a start pulse signal SP and to three of four clock signals C1 to C4. Referring to FIG. 2, the start pulse signal SP is applied during either each frame or each horizontal period in synchrony with the fourth clock signal C4. The phase of each of the first to fourth clock signals C1 to C4 is sequentially delayed such the fourth clock signal C4 is applied first, followed by the first clock signal C1, followed by the second clock signal C2, followed by the third clock signal C3.

As shown in FIGS. 1 and 2, the first stage ST1 outputs a first output signal SO1 using three clock signals C1, C3, and C4 and the start pulse signal SP. Subsequently, the second to $n^{th}$ stages ST2 to STn output second to $n^{th}$ output signals SO2 to SOn using various combinations of three of the four clock signals C1 to C4 and corresponding output signal SO1 to SOn-1 of the previous stage. As a result, the first to $n^{th}$ stage ST1 to STn of the related art shift register output the first to $n^{th}$ output signals SO1 to SOn, wherein the phase of the first to $n^{th}$ output signals SO1 to SOn is sequentially shifted as shown in FIG. 2. Accordingly, the first to $n^{th}$ output signals SO1 to SOn are applied as scan signals to sequentially drive the gate lines of the liquid crystal display panel. Moreover, the first to $n^{th}$ output signals SO1 to SOn are provided as the sampling signals by which the data driver sequentially samples the externally inputted video signals.

FIG. 3 illustrates a circuit diagram of a first stage ST1 within the related art shift register shown in FIG. 1.

Referring to FIG. 3, the first stage ST1 includes a first controller 32 for controlling a Q node in accordance with the start pulse signal SP and the fourth clock signal C4; a second controller 34 for controlling a QB node in accordance with the start pulse signal SP and the third clock signal C3; and an output buffer part 36 for selecting a first clock signal C1 or a first supply voltage VSS in accordance with a voltage present at the Q and QB nodes.

Accordingly, the first controller 32 includes a first PMOS transistor T1 connected in a diamond configuration to an input line of the start pulse signal SP; a second PMOS transistor T2 connected between the Q node, an input line of the fourth clock signal C4, and the first PMOS transistor T1; a third PMOS transistor T3 connected between the Q node, the QB node, and an input line of the first supply voltage VSS for controlling the Q node in conjunction with a seventh PMOS transistor T7.

The second controller 34 includes a fourth PMOS transistor T4 connected between an input line of a second supply voltage VDD, an input line of the third clock signal C3, and the QB node; and a fifth PMOS transistor T5 connected between the fourth PMOS transistor T4, the input line of the start pulse signal SP, and the input line of the first supply voltage VSS.

The output buffer part 36 includes a sixth PMOS transistor T6 for selecting the first clock signal C1 in accordance with the voltage present at the Q node and for outputting the first clock signal C1 as the first output signal SO1; and a seventh PMOS transistor T7 for selecting the first supply voltage VSS in accordance with the voltage present at the Q node and for outputting the first supply voltage VSS as the first output signal SO1.

The first stage ST1 further includes a first capacitor CB connected between the gate and source terminals of the sixth PMOS transistor T6 (i.e., between the Q node and the output line to which the first output signal SO1 is applied).

Referring back to FIG. 2, the start pulse signal SP and the first to fourth clock signals C1 to C4 are provided as negative voltages with swing voltage between 10V and 25V when they are applied to the shift register, wherein a voltage of 17V represents a low state and a voltage of −8V represents a high state. The first supply voltage VSS applies the low state voltage of 17V to the first stage ST1 while the second supply voltage VDD applies the high state voltage of −8V.

Referring now to FIGS. 2 and 3, during a first period of time, t1, the start pulse signal SP and the fourth clock signal C4 are simultaneously provided in the high state. Accordingly, the first and second PMOS transistors T1 and T2 are turned on to transmit a high state voltage to the Q node. As a result, the sixth PMOS transistor T6, having its gate terminal connected to the Q node, is slowly turned on. Also during the first period of time, t1, the start pulse signal SP turns the fifth PMOS transistor T5 on, wherein the turned-on fifth PMOS transistor T5 transmits the first supply voltage VSS (i.e., the low state voltage) to the QB node. Accordingly, the third and seventh PMOS transistors T3 and T7, having their gate terminals connected to the QB node, are turned off. As a result, the first clock signal C1, provided in the low state and having a voltage of 17V, is outputted as the first output signal SO1 of the first stage ST1 via the turned-on sixth PMOS transistor T6.

During a second period of time, t2, the start pulse signal SP and the fourth clock signal C4 are simultaneously provided in a low state while the first clock signal C1 is provided in a high state. Accordingly, the first and second PMOS transistors T1 and T2 are turned off and the sixth transistor T6 is completely turned on. More specifically, the first capacitor CB and an internal parasitic capacitor Cgs (not shown), defined between a gate and a source terminal of the sixth PMOS transistor T6, induce a bootstrapping phenomenon at the Q node, wherein the Q node is placed in a floating state by the high state voltage of the first clock signal C1. Accordingly, a voltage value present at the floating Q node is higher than the high state of −8V. Since the sixth PMOS transistor T6 is completely turned on, the high state voltage of the first clock signal C1 (i.e., −8V) is charged to the output line of the stage ST1. Accordingly, the output line of the first stage ST1 outputs an output signal SO1 representing a high state.

During a third period of time, t3, the first clock signal C1 is provided in the low state while the second clock signal C2 is provided in the high state. Accordingly, the voltage value present at the floating Q node is lowered back to the high state and the sixth PMOS transistor T6 is maintained in its turned-on state. As a result, the low state voltage (i.e., 17V) of the first clock signal C1 is outputted as the output signal SO1 via the turned-on sixth PMOS transistor T6.

During a fourth period of time, t4, the third clock signal C3 is provided in the high state to turn the fourth PMOS transistor T4 on, thereby applying the second supply voltage VDD (i.e., the high state voltage of −8V) to the QB node. Accordingly, the third and seventh PMOS transistors T3 and T7 are simultaneously turned on. Subsequently, the low state first supply voltage VSS is applied to the Q node via the turned-on third PMOS transistor T3, thereby turning the sixth PMOS transistor T6 off. As a result, the low state first supply voltage VSS is outputted as the output signal SO1 of the first stage ST1 via the turned-on seventh PMOS transistor T7.

During a fifth period of time, t5, only the fourth clock signal C4 is provided in the high state, wherein the second transistor T2 is turned on while the first, fourth, and fifth PMOS transistors T1, T4, and T5 remain turned off. Accordingly, the voltage present at the QB node is maintained in the high state. As a result, the third and seventh PMOS transistors T3 and T7 remain in their turned-on states to output a low state voltage as the output signal SO1 of the first stage ST1.

As shown above, via the start pulse signal SP and three of four clock signals, the output signal SO1 of the related art first stage ST1 has an ideal swing voltage between 10V and 25V. However, if a threshold voltage Vth of the first and seventh PMOS transistors T1 to T7 is excessively low, a leakage current may be generated, causing distortion of the output signal SO1.

More specifically, and with reference to FIG. 4, if the threshold voltage Vth of the first and seventh PMOS transistors T1 to T7 is excessively low, a leakage current is generated during the second period of time, t2, when the voltage value at the Q node is higher than the high state voltage of −8V. More specifically, leakage current is transmitted along a first leakage current path LCP1, through the fourth PMOS transistor T4, and along second leakage current path LCP2, through the third PMOS transistor T3. During the second period of time, t2, the low state voltage present at the QB node is meant to prevent the voltage of the Q node from being altered. However, due to the presence of the first leakage current path LCP1, the voltage present at the QB node deteriorates from the low state (17V) to the high state (−8V). Furhter, the third PMOS transistor T3 is turned on slightly, and the leakage current transmitted along the second leakage current path LCP2 is increased. Accordingly, the voltage present at the Q node deteriorates from a voltage higher than the high state to the low state voltage due to the presence of the second leakage current path LCP2. When the voltage present at the Q node changes, the conductive path between the drain and source electrodes of the sixth PMOS transistor T6 becomes restrained and the voltage value of the high state output signal SO1, outputted by the sixth PMOS transistor T6, deteriorates from −8V to a lower state value of −7.5V (as shown in FIG. 5).

As mentioned above, the output signal SO1 of the related art first stage ST1 is used as start pulse signal of the next stage, ST2. Moreover, the second to $n^{th}$ stages ST2 to STn are constructed similarly as described above with respect to FIGS. 3 and 4. Accordingly, as the output signal SO1 is propagated through the plurality of cascade connections as start pulse signals SP of succeeding stages, the distortion contained therein increases the leakage current within subsequent stages, thereby deteriorating the reliability of the shift register.

SUMMARY OF THE INVENTION

Accordingly, the present invention is directed to a shift register capable of preventing an output signal from becoming distorted due to generation of a leakage current, that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a shift register may, for example, include stages for shifting an input signal in accordance with phase-delayed control signals, a first supply voltage, and a second supply voltage, and for applying the shifted input signals as output signals and as input signals of succeeding ones of stages, wherein each of the stages may, for example, include a first controller for selectively applying an input signal and a first supply voltage to a first node arranged between first to third transistors that form a conductive path between a supply line of the input signal and an input line of the first supply voltage; a second controller for selectively applying the first supply voltage and the second supply voltage to a second node arranged between fourth and fifth transistors forming a conductive path between an input line of the second supply voltage and the input line of the first supply voltage; and an output buffer for selectively applying a predetermined control signal and the first supply voltage as an output signal to an output line of the stage between sixth and seventh transistors forming a conductive path between the input line of the first supply voltage and an input line of the predetermined control signal, wherein the fifth transistor of the second controller may be turned on to sustain a voltage present at the second node equal to the first supply voltage when the fourth transistor is turned off.

In one aspect of the present invention, the first and second transistors may, for example, include first and second conductive paths, respectively, arranged between the supply line of the input signal and the first node and first and second control electrodes, respectively, for controlling the conductive path in accordance with the input signal and a first control signal; and the third transistor may, for example, include a third conductive path arranged between the first node and the input line of the first supply voltage and a third control electrode for controlling the conductive path in accordance with a voltage present at the second node.

In another aspect of the present invention, the fourth transistor may, for example, include a fourth conductive path arranged between the input line of the second supply voltage and the second node and a fourth control electrode for controlling the fourth conductive path in accordance with a second control signal; and the fifth transistor may, for example, include a fifth conductive path arranged between the second node and the input line of the first supply voltage and a fifth control electrode for controlling the fifth conductive path in accordance with a voltage of a third node arranged between the first and second transistors.

In still another aspect of the present invention, each stage may further include an eighth transistor for turning the fifth transistor off when the fourth transistor is turned on.

In yet another aspect of the present invention, the eighth transistor may, for example, include an eighth conductive path arranged between the fifth control electrode of the fifth transistor and the input line of the first supply voltage and an eighth control electrode for controlling the eighth conductive path in accordance with the second control signal.

In still a further aspect of the present invention, the sixth transistor may, for example, include a sixth conductive path arranged between an input line of a third control signal and an output line of the stage and a sixth control electrode for controlling the sixth conductive path in accordance with the voltage of the first node; and the seventh transistor may, for example, include a seventh conductive path arranged between the output line of the stage and the input line of the first supply voltage and a seventh control electrode for controlling the seventh conductive path in accordance with the voltage of the second node.

In yet a further aspect of the present invention, a capacitor for bootstrapping the voltage of the sixth control electrode may be provided, wherein the capacitor may be connected between the sixth control electrode and the output line of the stage.

In still a further aspect of the present invention, the third transistor may, for example, include a dual gate transistor having control electrodes commonly connected to the second node.

In yet another aspect of the present invention, the fifth transistor may, for example, includes a dual gate transistor having control electrodes commonly connected to the third node.

In still another aspect of the present invention, transistors within each stage may have the same channel type.

In another aspect of the present invention, transistors within each stage are PMOS transistors.

In one aspect of the present invention, the second supply voltage may be higher than the first supply voltage.

In another aspect of the present invention, the first supply voltage may be a negative voltage.

In still another aspect of the present invention, the first to third control signals may include three clock signals selected from first to fourth clock signals, wherein each of the four clock signals have different phases from each other and have a predetermined voltage state within a predetermined period of time.

In yet another aspect of the present invention, the phase of the third control signal may be delayed with respect to the phase of the first control signal by one clock and the phase of the second control signal may be delayed with respect to the phase of the third control signal by two clocks.

In still another aspect of the present invention, a phase of a portion of the input signal may be the same as the phase of the first control signal.

In yet a further aspect of the present invention, the shift register may be used with at least one of a scan driver for driving scan lines of a display device and a data driver for driving data lines of the display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

According to principles of the present invention, a shift register may comprise a plurality of stages connected in cascade to each other. The first of the plurality of stages may be connected to an input line of a start pulse signal SP while output signals of preceding ones of the plurality of stages may by applied as input start pulse signals of succeeding ones of the stages.

Figure 1:
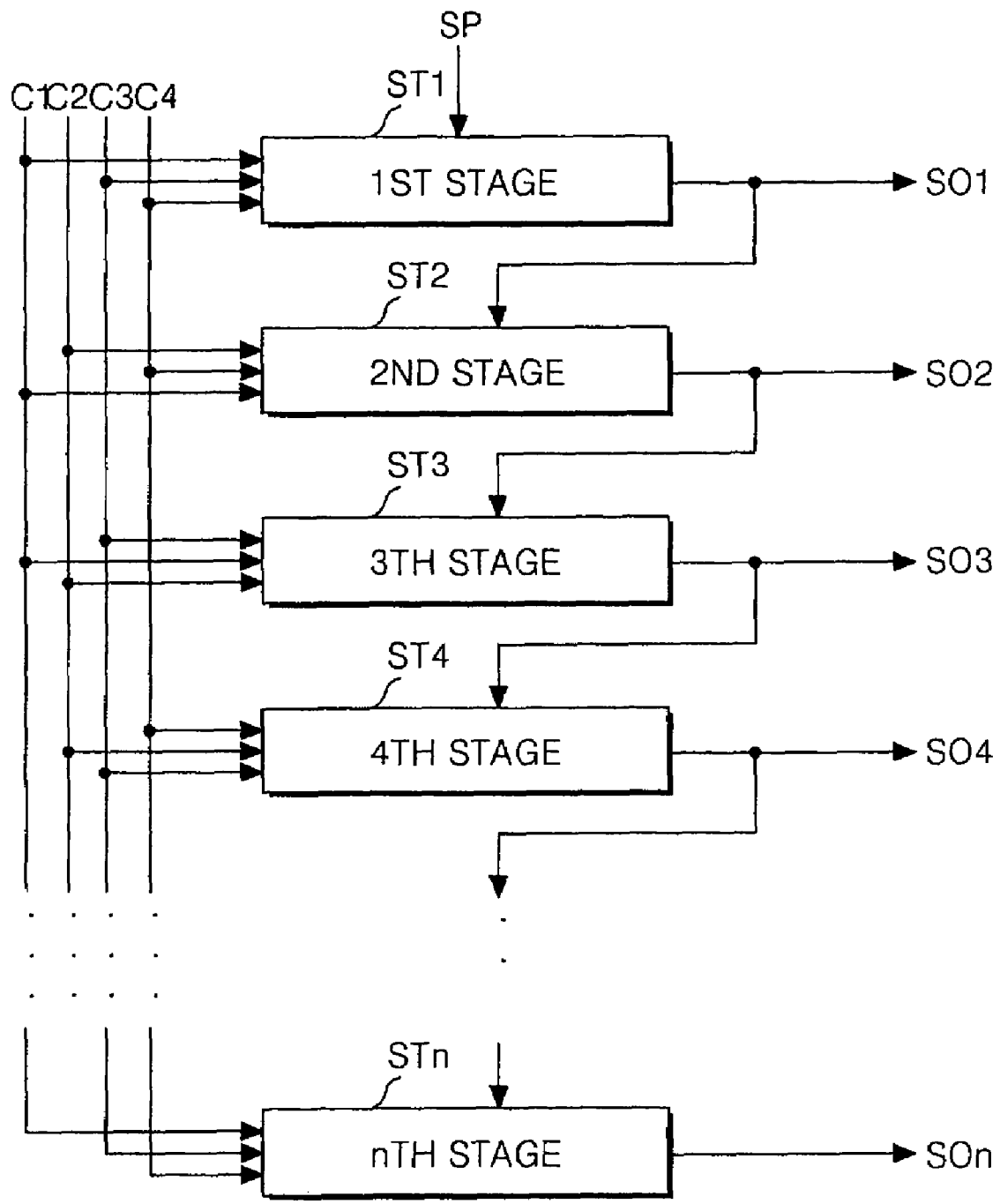
FIG. 1 schematically illustrates a related art shift register.
Figure 2:
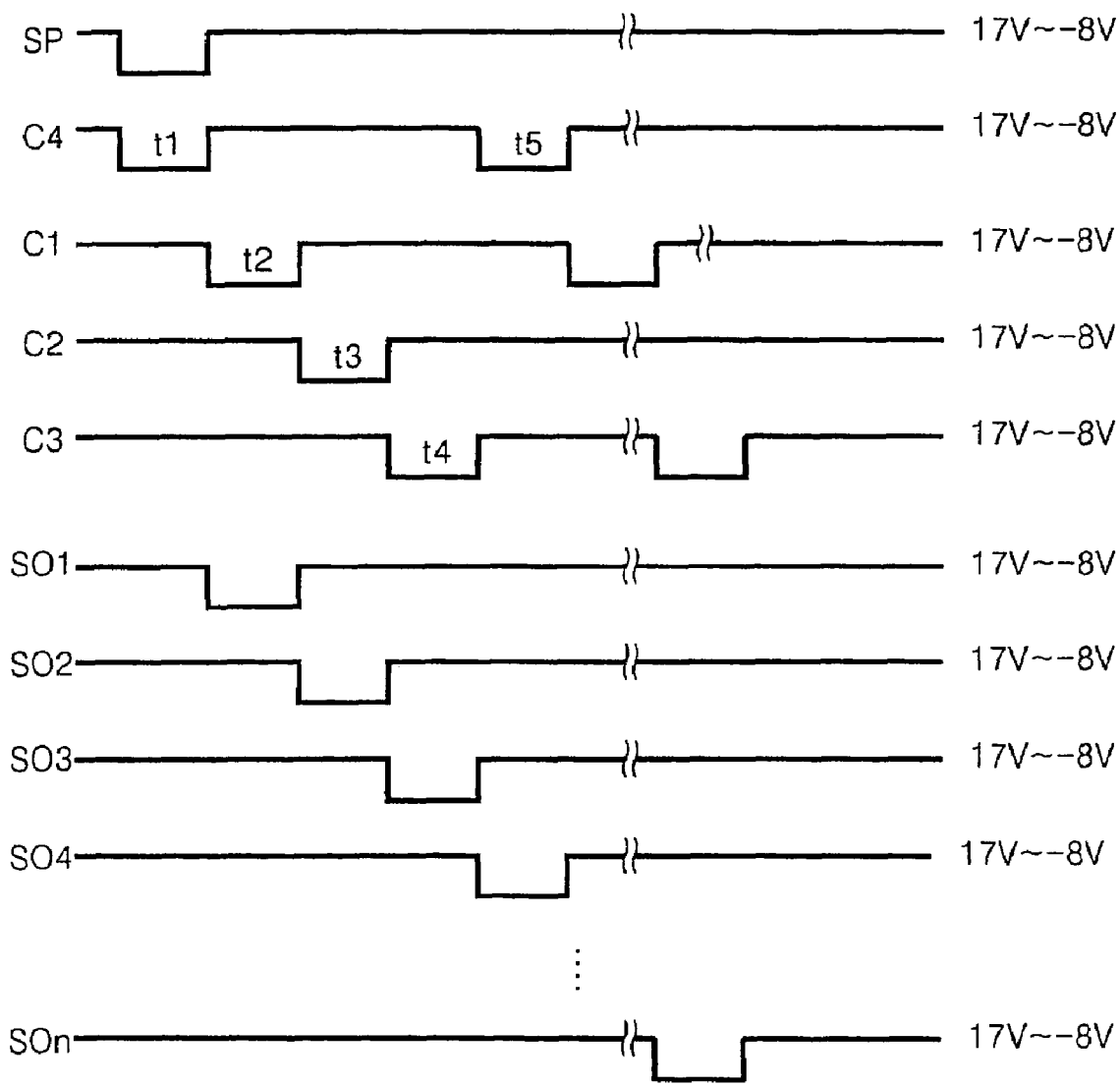
FIG. 2 illustrates input/output waveforms of the related art shift register shown in FIG. 1.
Figure 3:
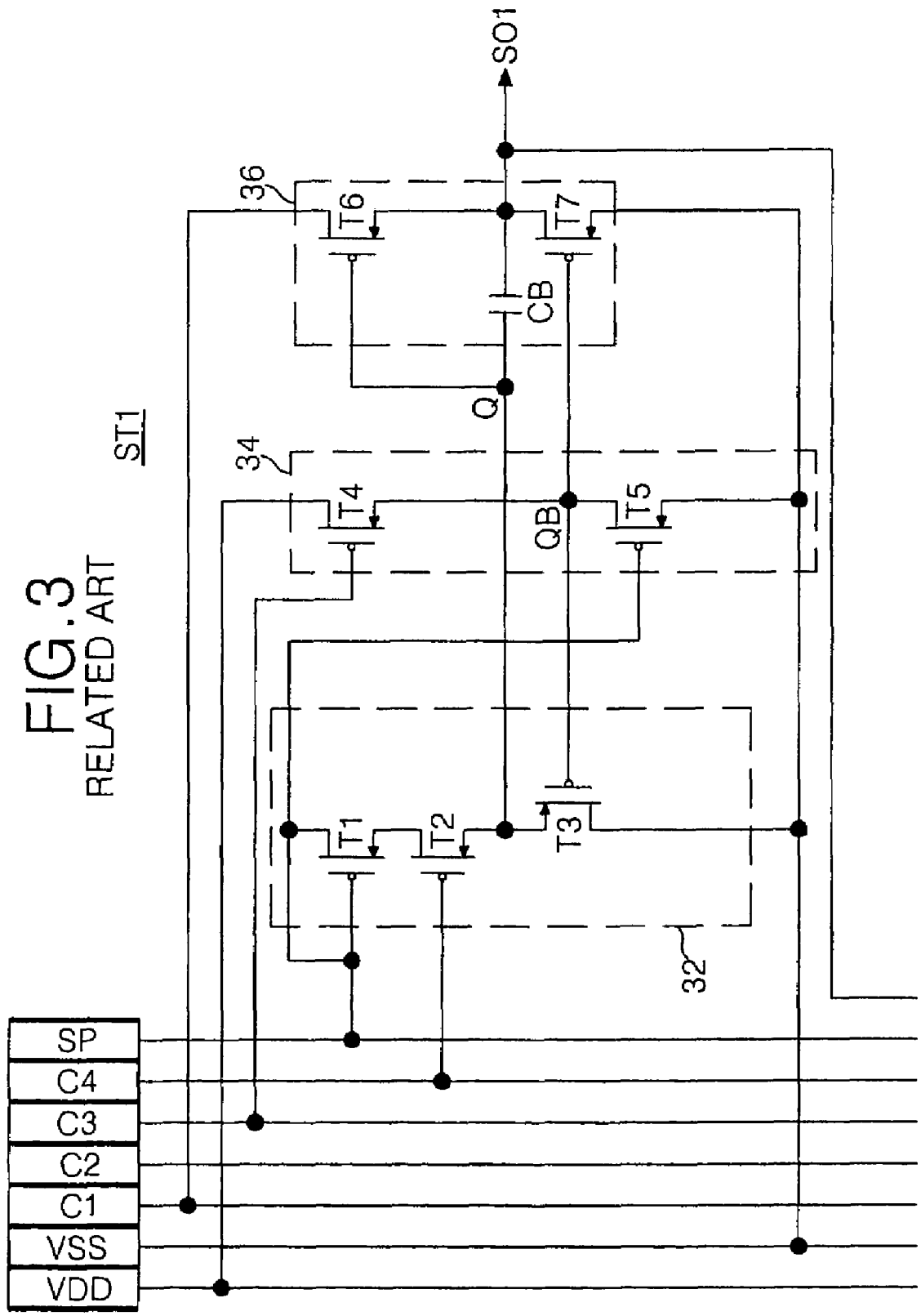
FIG. 3 illustrates a circuit diagram of a first stage ST1 within the related art shift register shown in FIG. 1.
Figure 4:
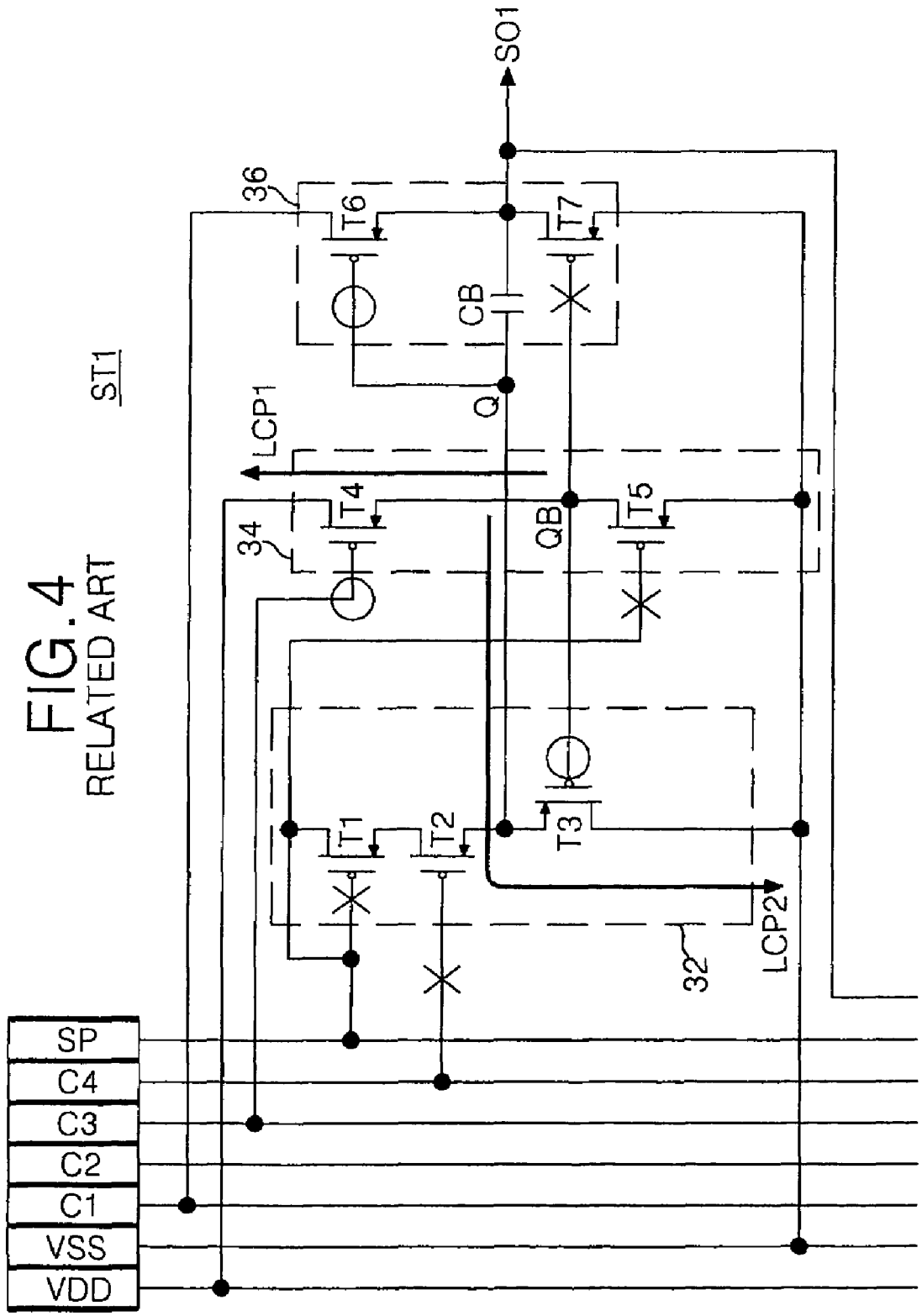
FIG. 4 illustrates leakage paths within the stage shown in FIG. 3.
Figure 5:
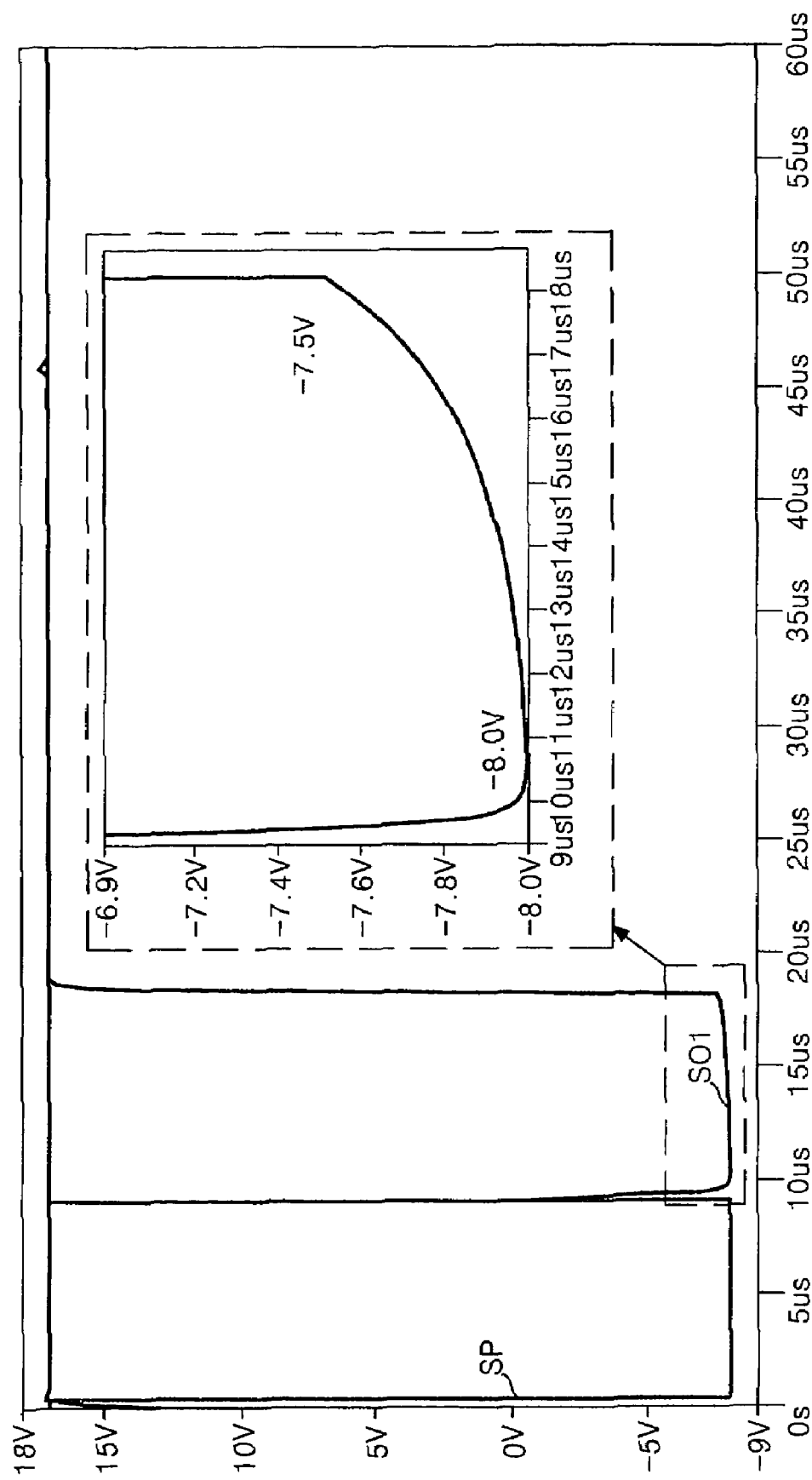
FIG. 5 illustrates a waveform diagram of distortion in an output signal caused by the leakage current within the stage shown in FIG. 3.
Figure 6:
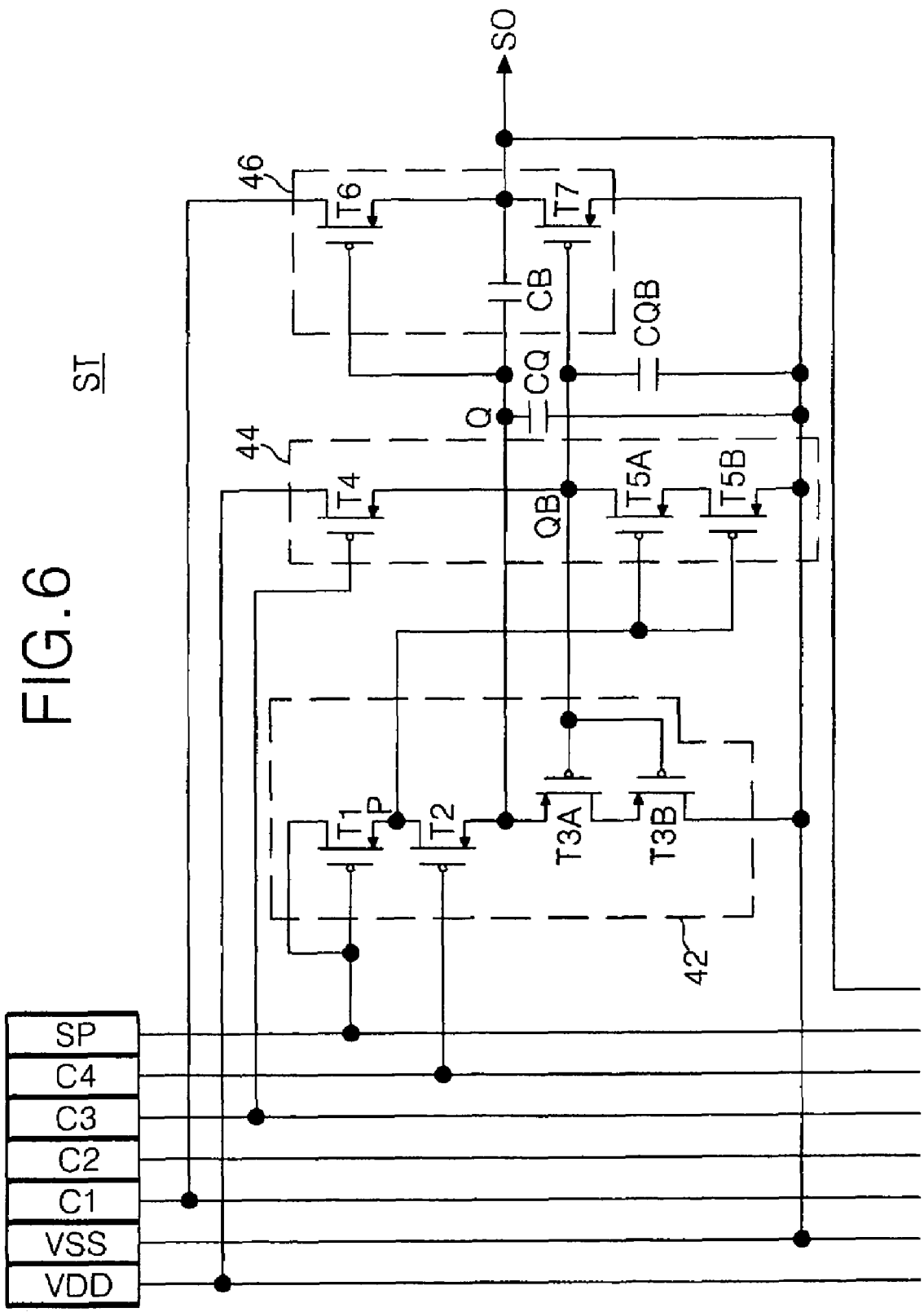
FIG. 6 illustrates a circuit diagram of a stage in a shift register according to a first embodiment of the present invention.
Figure 7:
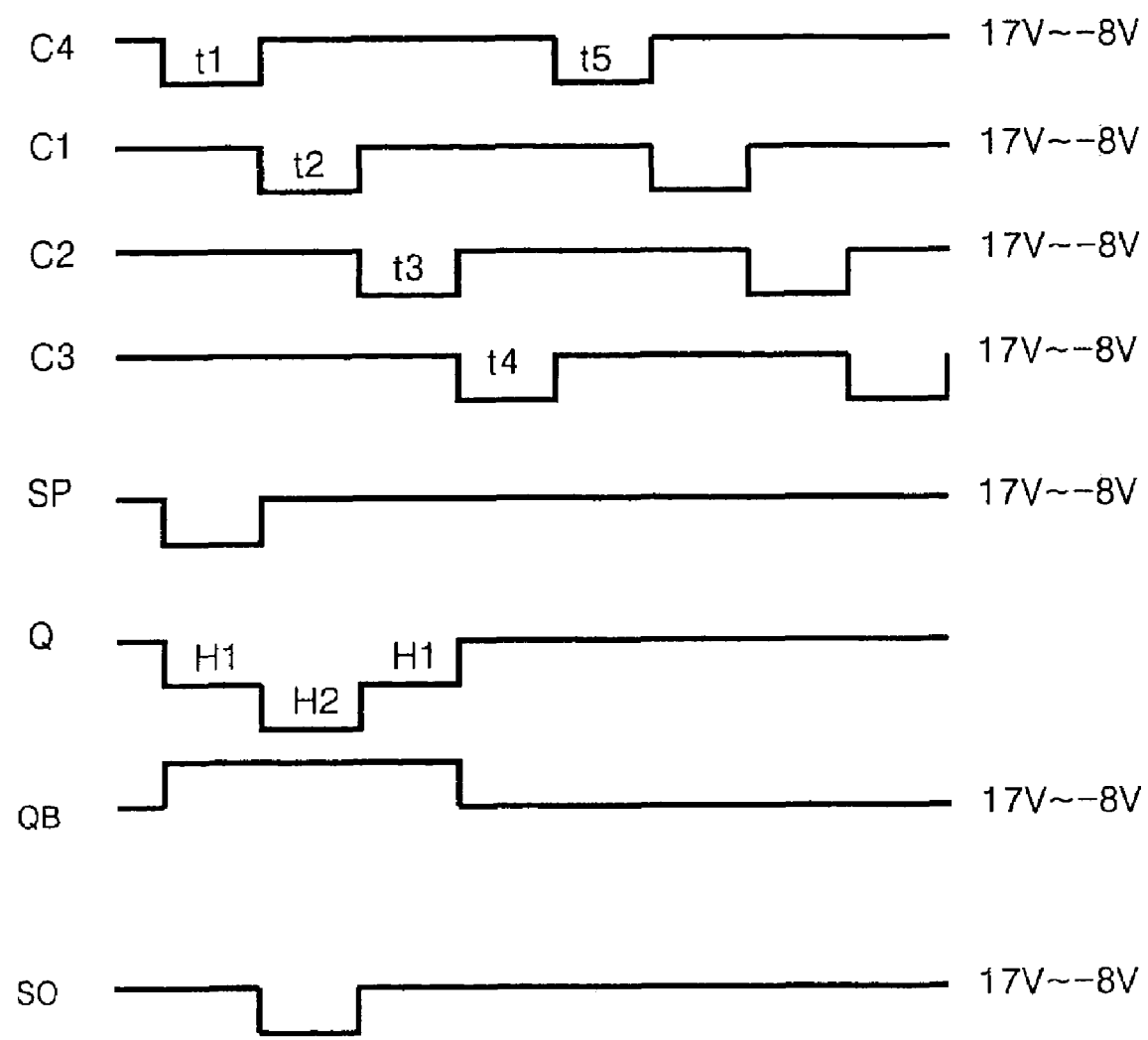
FIG. 7 illustrates input/output waveforms of the stage shown in FIG. 6.

FIG. 6 illustrates a circuit diagram of a stage in a shift register according to a first embodiment of the present invention. FIG. 7 illustrates input/output waveforms of the stage shown in FIG. 6.

Referring to FIG. 6, a stage ST within a shift register according to a first embodiment of the present invention may, for example, include a first controller 42 for controlling a Q node in accordance with a start pulse signal SP and a fourth clock signal C4; a second controller 44 for controlling a QB node in accordance with a third clock signal C3 and the start pulse signal SP; and an output buffer 46 for selecting one of a first clock signal C1 or a first supply voltage VSS in accordance with a voltage present at the Q and QB nodes and for outputting the selected one of the first clock signal C1 and the first supply voltage VSS.

According to principles of the present invention, the first to seventh transistors T1 to T7 of the stage ST may be provided as PMOS or NMOS transistors. For the sake of convenience, however, description of the shift register of the present invention will be made wherein the first to seventh transistors are provided as PMOS transistors.

In one aspect of the present invention, the first controller 42 may, for example, include a first PMOS transistor T1 connected in a diamond configuration to an input line of the start pulse signal SP and a P node; a second PMOS transistor T2 connected between the P node, an input line of the fourth clock signal C4 and the Q node; A and B ones of third PMOS transistors T3A and T3B connected between the Q node, the QB node, and an input line of the first supply voltage VSS for controlling the voltage present at the Q node in conjunction with a seventh PMOS transistor T7. According to principles of the present invention, A and B ones of the third PMOS transistors T3A and T3B may have a dual gate structure having an overall threshold voltage Vth increased with respect to a corresponding PMOS transistor having a single gate structure to minimize a leakage current.

The second controller 44 may, for example, include a fourth PMOS transistor T4 connected between an input line of a second supply voltage VDD, an input line of the third clock signal C3, and the QB node; and A and B ones of fifth PMOS transistors T5A and T5B connected between the fourth PMOS transistor T4, the P node, and the input line of the first supply voltage VSS. According to principles of the present invention, A and B fifth PMOS transistors T5A and T5B may have a dual gate structure having an overall threshold voltage Vth increased with respect to a corresponding PMOS transistor having a single gate structure to minimize a leakage current.

The output buffer part 46 may, for example, include a sixth PMOS transistor T6 connected between an input line of the first clock signal C1, the Q node, and an output line for selecting the first clock signal C1 in accordance with the voltage present at the Q node and for applying the selected clock signal as an output signal SO; and a seventh PMOS transistor T7 connected between the input line of the first supply voltage VSS, the CQ node, and the output line for selecting the first supply voltage VSS in accordance with the voltage present at the Q node and for applying the selected voltage as an output signal SO.

The stage ST may further include a first capacitor CB connected between the gate and source terminal of the sixth PMOS transistor T6 (i.e., between the Q node and the output line to which the output signal SO is applied); a second capacitor CQ connected between the Q node and the input line of the first supply voltage VSS; and a third capacitor CQB connected between the gate and source terminals of the seventh PMOS transistor T7 (i.e., between the QB node and the input line of the first supply voltage VSS). According to principles of the present invention, the first capacitor CB may induce a bootstrap phenomenon at the Q node, wherein the voltage present at the Q node rises during a predetermined period of time and wherein the second and third capacitors CQ and CQB, the noise component of the Q node and the QB node, are bypassed.

Referring to FIGS. 6 and 7, the stage ST may, for example, receive predetermined ones of the first to fourth clock signals C1 to C4 (e.g., first, third, and fourth clock signals C1, C3, and C4) as control signals. The phase of each of the first to fourth clock signals C1 to C4 may be sequentially delayed such the fourth clock signal C4 is applied first, followed by the first clock signal C1, followed by the second clock signal C2, followed by the third clock signal C3.

Referring to FIG. 7, the start pulse signal SP and the first to fourth clock signals C1 to C4 are provided as negative voltages with a swing voltage of at least about 10V (e.g., about 25V), wherein a voltage of about 17V represents a low state and a voltage of about −8V represents a high state. The first supply voltage VSS may apply the low state voltage of about 17V to the stage ST while and the second supply voltage VDD may apply the high state voltage of about −8V.

Referring now to FIGS. 6 and 7, during a first period of time, t1, the start pulse signal SP and the fourth clock signal C4 may be simultaneously provided in the high state. Accordingly, the first and second PMOS transistors T1 and T2 may be turned on to transmit a high state voltage to the Q node, thereby providing the Q node in a first high state H1. As a result, the sixth PMOS transistor T6, having its gate terminal connected to the Q node, is slowly turned on and the high state voltage is present at the P node, arranged between the turned-on first and second PMOS transistors T1 and T2. Also during the first period of time, t1, the start pulse signal SP representing the high state turns the fifth PMOS transistor T5 on, wherein the turned-on fifth PMOS transistor T5 transmits the first supply voltage VSS (i.e., the low state voltage) to the QB node. Accordingly, the third A and B PMOS transistors T3A and T3B, and the seventh PMOS transistor T7, having their respective gate terminals connected to the QB node, are turned off. As a result, the first clock signal C1 having the low state voltage of about 17V is outputted as the output signal SO1 of the stage ST via the turned-on sixth PMOS transistor T6.

During a second period of time, t2, the start pulse signal SP and the fourth clock signal C4 are simultaneously provided in the low state while the first clock signal C1 is provided in the high state. Accordingly, the first and second PMOS transistors T1 and T2 are turned off and the sixth PMOS transistor T6 is completely turned on. More specifically, the first capacitor CB and an internal parasitic capacitor Cgs (not shown), defined between a gate and source terminal of the sixth PMOS transistor T6, induce a bootstrapping phenomenon at the Q node, wherein the Q node is placed in a floating state having a voltage corresponding to a second high state, higher than the first high state voltage, upon application of the high state voltage of the first clock signal C1. Since the sixth PMOS transistor T6 is completely turned on, the high state voltage of the first clock signal C1 (i.e., about −8V) is charged to the output line of the stage ST. Accordingly, the output line of the stage ST outputs an output signal SO1 representing the high state.

Still during the second period of time, t2, the turned-off first and second PMOS transistors T1 and T2 induce the P node into a floating state such that the high state voltage is sustained at the P node. Moreover, the A and B fifth PMOS transistors T5A and T5B remained turned on because their respective gate terminals are connected to the P node. Accordingly, the low state first supply voltage VSS may be sustained at the QB node even though a leakage current is present at the fourth PMOS transistor T4. As a result, deterioration of the high state output signal SO may be prevented due to the leakage current present at the fourth PMOS transistor T4.

During a third period of time, t3, the first clock signal C1 may be provided in the low state while the second clock signal C2 may be provided in the high state. Accordingly, the voltage value present at the floating Q node is lowered back from the second high state to the first high state and the sixth PMOS transistor T6 is maintained in its turned-on state. As a result, the low state voltage (i.e., about 17V) of the first clock signal C1 may be outputted as the output signal SO via the turned-on sixth PMOS transistor T6.

Still during the third period of time, t3, the floating P node, having the high state voltage, maintains the A and B fifth PMOS transistors T5A and T5B in their turned-on states, thereby allowing the low state first supply voltage VSS to be maintained at the QB node.

During the fourth period of time, t4, the third clock signal C3 may be provided in the high state to turn the fourth PMOS transistor T4 on, thereby applying the high state second supply voltage VDD of about −8V to the QB node. Accordingly, the third and seventh PMOS transistors T3 and T7 may be simultaneously turned on. Subsequently, the low state first supply voltage VSS is applied to the Q node via the turned-on third PMOS transistor T3, thereby turning the sixth PMOS transistor T6 off. As a result, the low state first supply voltage VSS may be outputted as the output signal SO of the stage ST via the turned-on seventh PMOS transistor T7.

During a fifth period of time, t5, only the fourth clock signal C4 is provided in the high state, wherein the second transistor T2 may be turned on and the first, fourth, and A and B fifth PMOS transistors T1, T4, T5A, and T5B may remain in their turned-off states. Accordingly, the voltage present at the floating QB node is maintained in the high state. As a result, the third and seventh PMOS transistors T3 and T7, remain in their turned-on states to output a low state voltage as the output signal SO of the stage ST.

As described above, stages within the shift register according to the first embodiment of the present invention may connect gate terminals of A and B fifth PMOS transistors T5A and T5B to the P node, arranged between the first and second PMOS transistors T1 and T2, to prevent a voltage present at the QB node from deteriorating due to a leakage current at the fourth PMOS transistor T4. Accordingly, the voltage present at the Q node does not change due to a deterioration of the voltage of the QB node, thereby preventing the high state voltage of the output signal SO, applied to the output line of the stage via the sixth PMOS transistor T6, from becoming deteriorated. Further, the turned-on A and B fifth PMOS transistors T5A and T5B may minimize the extent to which the low state of the output signal SO changes during the fourth period of time, t4, when the third clock signal C3 is provided in the high state.

Figure 8:
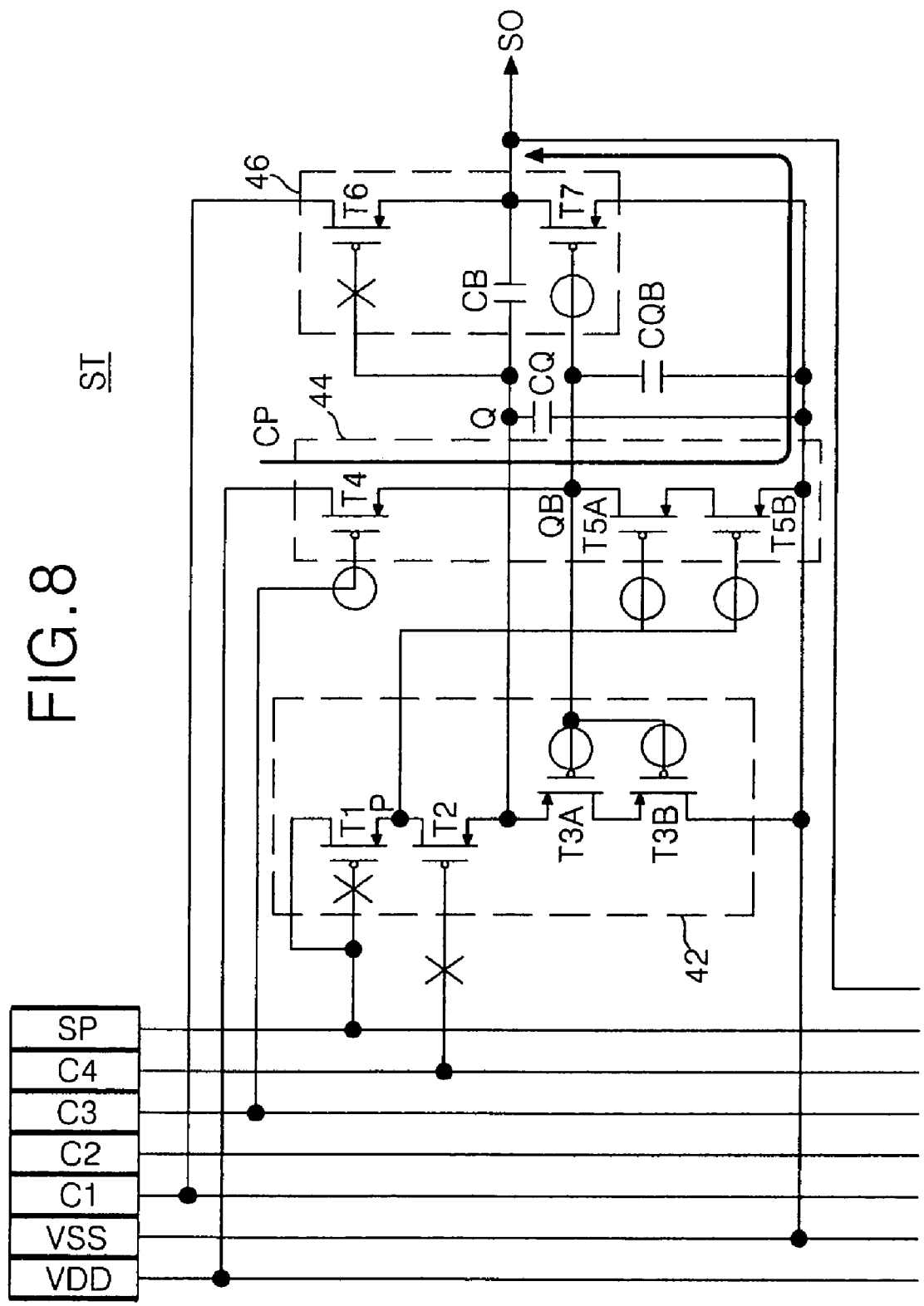
FIG. 8 illustrates a current path during a fourth period of time, t4, within the stage shown in FIG. 6.

Referring now to FIG. 8, during the fourth period of time, t4, when the third clock signal C3 is provided in the high state, the fourth PMOS transistor T4 is turned on and applies the high state second supply voltage VDD to the QB node, thereby turning on the A and B ones of the third PMOS transistors T3A and T3B and the seventh PMOS transistor T7.

Figure 9:
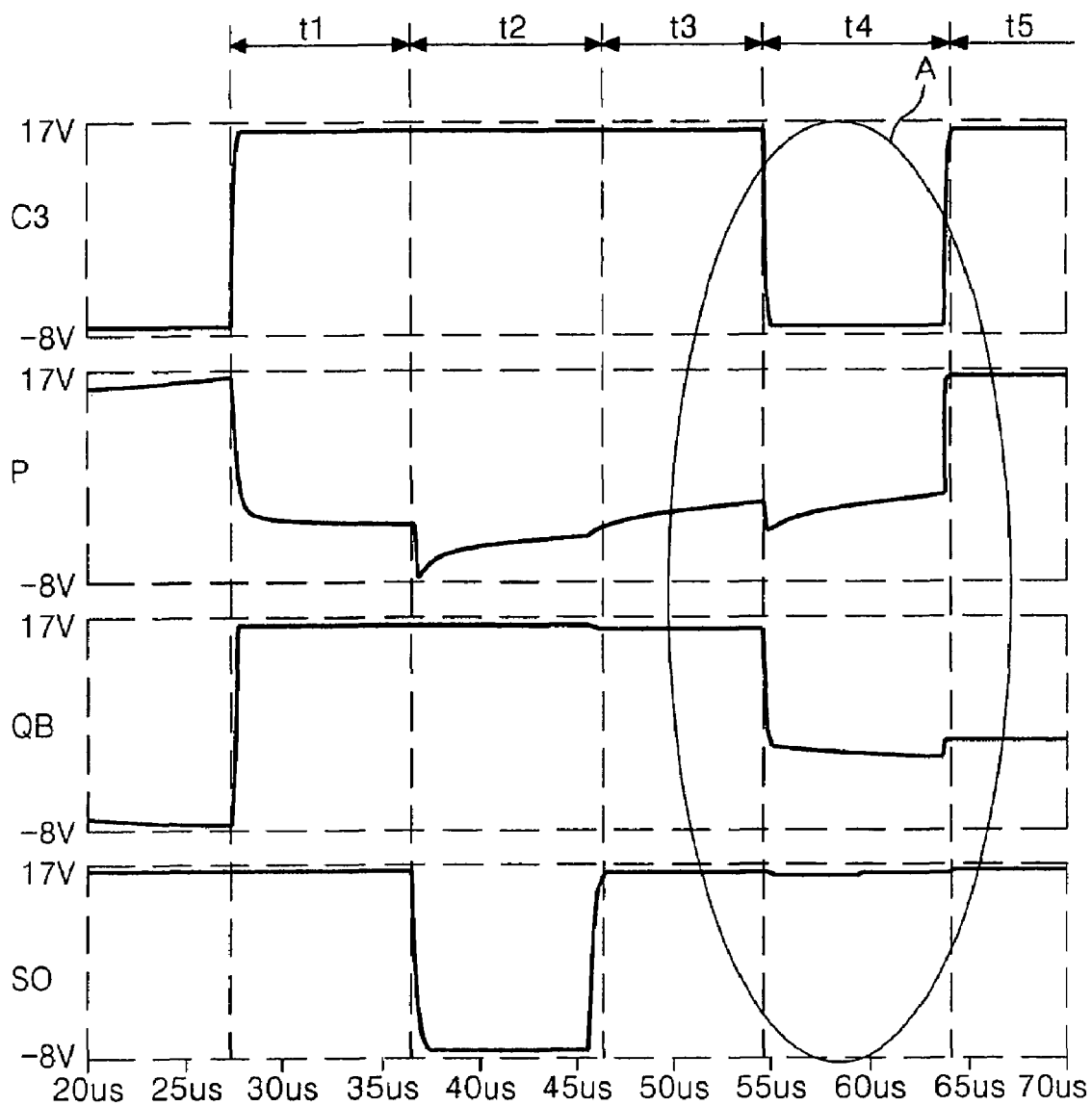
FIG. 9 illustrates waveform diagrams of each node within the stage shown in FIG. 8.

Referring to FIGS. 8 and 9, the high state voltage present at the P node during the first through third periods of time, t1 to t3, maintains the A and B fifth PMOS transistors T5A and T5B in turned-on states. Accordingly, the high state second supply voltage VDD is applied to the output line of the stage via the current path CP provided through the turned-on fourth, fifth A and B, and seventh PMOS transistors T4, T5A, T5B and T7. As a result, the output signal SO deleteriously deteriorates slightly toward the high state during the fourth period of time, t4, as shown in region "A" of FIG. 9. Optimally, however, the output signal SO should be maintained in the low state during the fourth period of time, t4.

Figure 10:
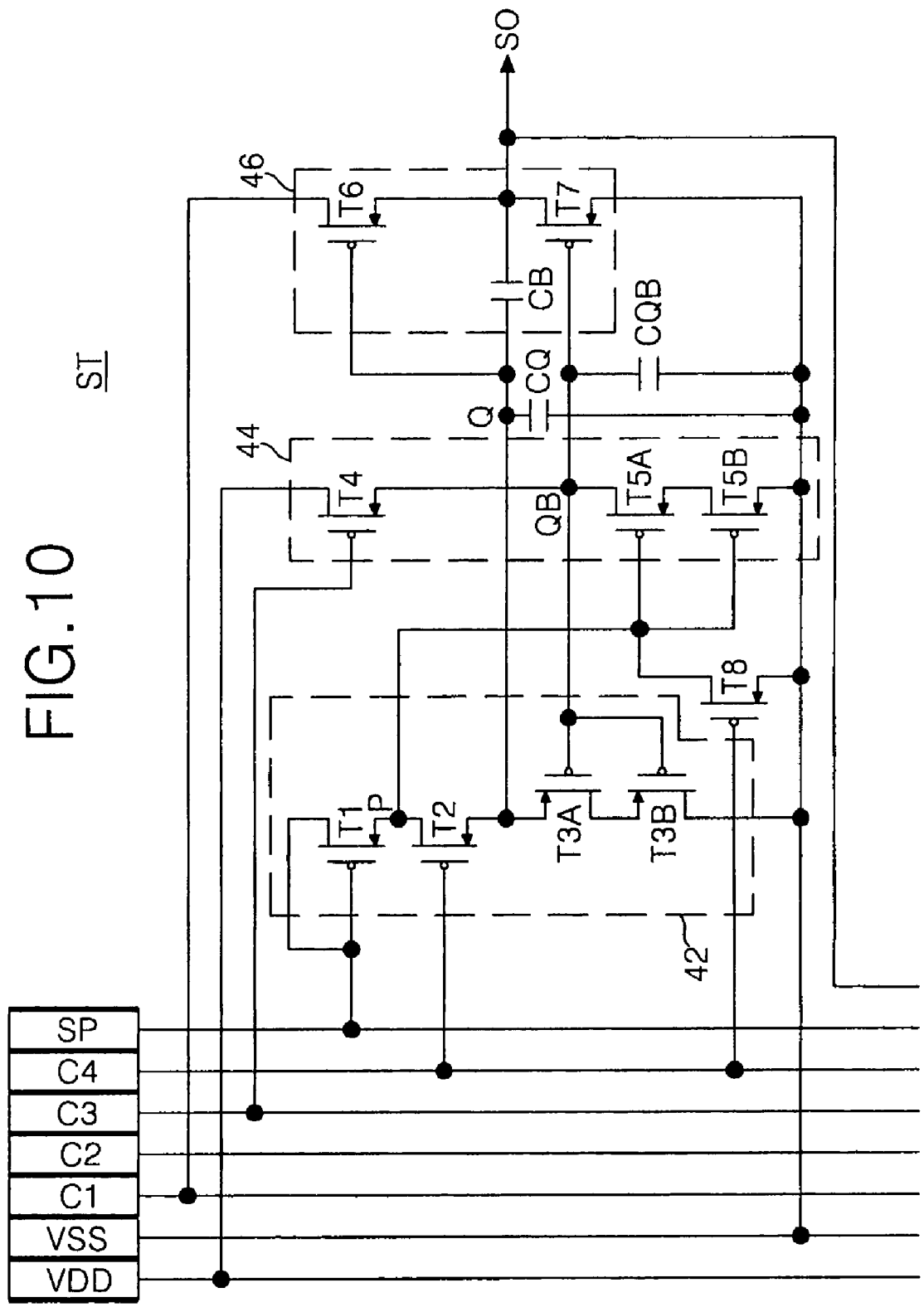
FIG. 10 illustrates a circuit diagram of a stage in a shift register according to a second embodiment of the present invention.

To prevent the aforementioned slight deterioration of the low state voltage value of the output signal SO, a shift register according to a second embodiment of the present invention may further include an eighth PMOS transistor T8 as shown in FIG. 10.

FIG. 10 illustrates a circuit diagram of a stage in a shift register according to a second embodiment of the present invention.

Referring to FIG. 10, a stage ST within a shift register according to a second embodiment of the present invention may be provided substantially as the stage within the shift register according to the first embodiment of the present invention and may further include an eighth PMOS transistor T8 connected between the gate terminals of the A and B fifth PMOS transistors T5A and T5B, the input line of the third clock signal C3, and the input line of the first supply voltage VSS.

According to principles of the present invention, the eighth PMOS transistor T8 may ensure that the A and B fifth PMOS transistors T5A and T5B are turned off during the fourth period of time, t4, when the third clock signal C3 is provided in the high state. For example, the high state third clock signal C3 turns the eighth PMOS transistor T8 such that low state first supply voltage VSS is applied to the gate terminals of the A and B fifth PMOS transistors T5A and T5B.

Figure 11:
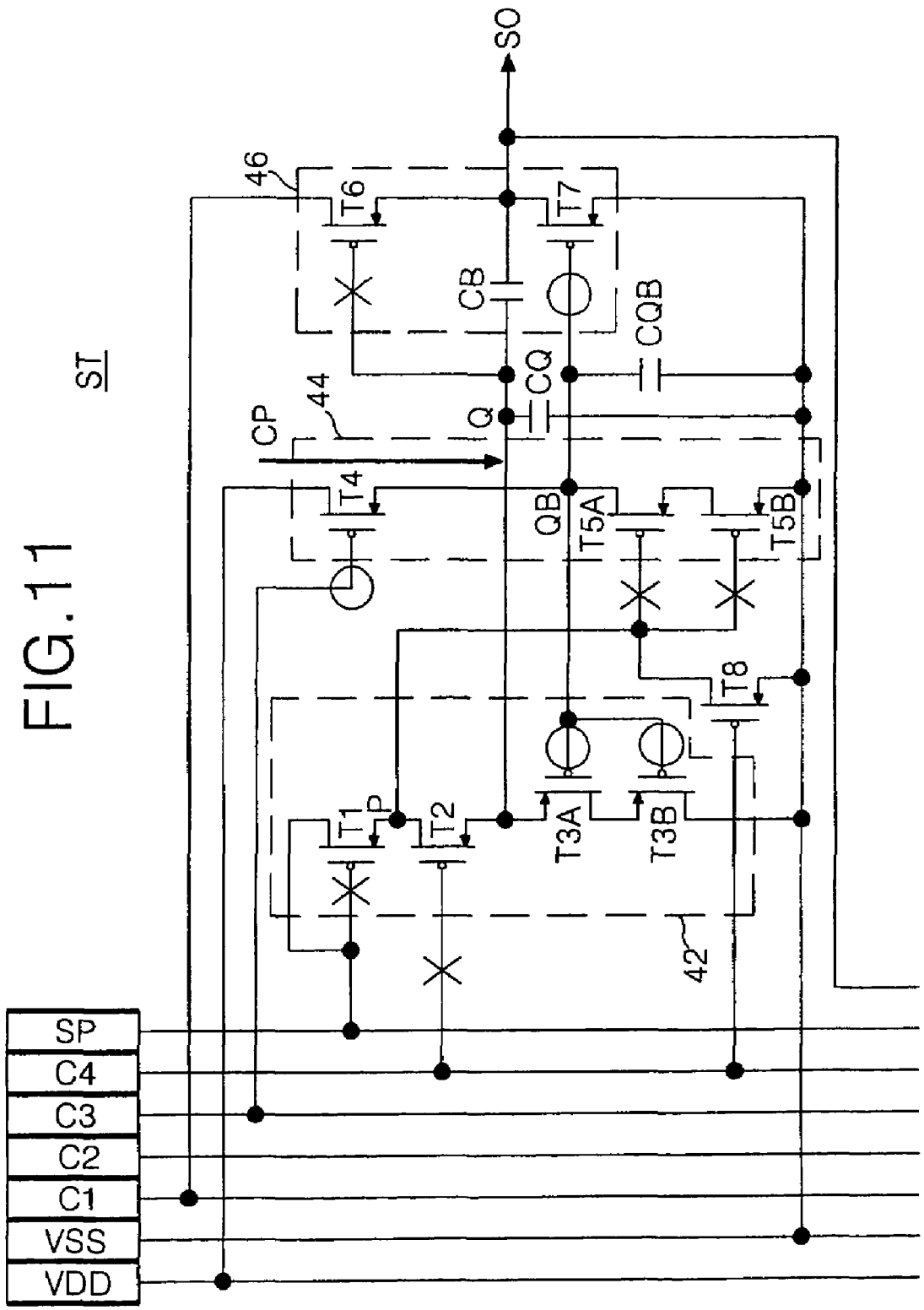
FIG. 11 illustrates a current path during a fourth period of time, t4, within the stage shown in FIG. 10.
Figure 12:
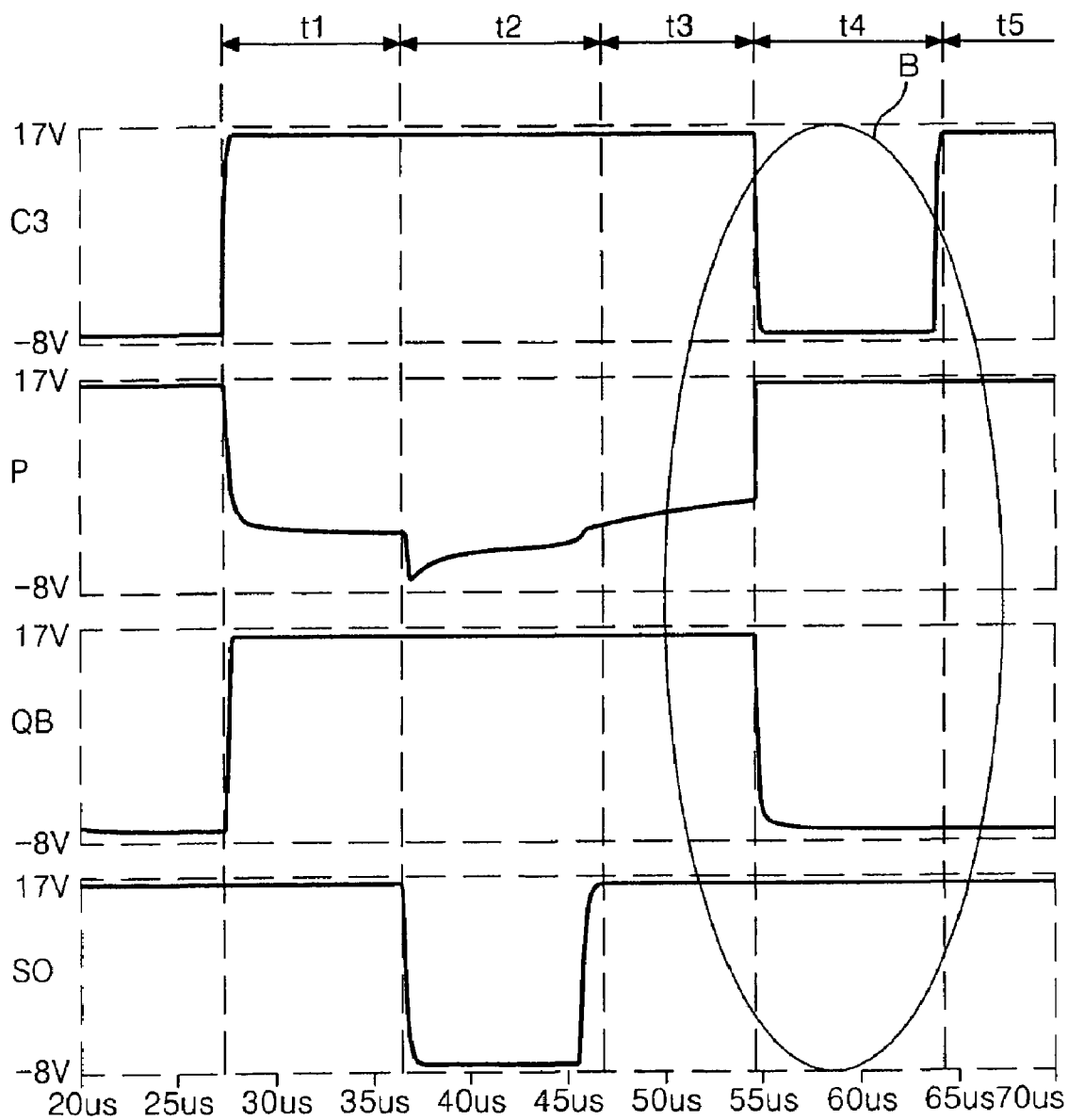
FIG. 12 illustrates waveform diagrams of each node within the stage shown in FIG. 11.

Referring to FIG. 11, during the fourth period of time, t4, the third clock signal C3 is provided in the high state and the high state second supply voltage VDD present at the QB node turns the third A and B and seventh PMOS transistors T3A, T3B and T7 on even though the fourth PMOS transistor T4 is turned on. The A and B fifth PMOS transistors T5A and T5B are turned off by the low state first supply voltage VSS in accordance with a voltage from the eighth PMOS transistor T8, which is turned on by the high state third clock signal C3. Accordingly, the current path CP, previously arranged through the turned-on fourth, fifth A and B, and seventh PMOS transistors T4, T5A, T5B and T7 as shown in FIG. 8, is arranged only through the turned-on fourth PMOS transistor T4, as shown in FIG. 11 due to the turned-of A and B fifth PMOS transistors T5A and T5B. Accordingly, the high state second supply voltage VDD may be prevented from flowing into the stage via the current path CP and the output signal SO of the stage can be maintained in the low state during the fourth period of time, t4, when the third clock signal C3 is provided in the high state (as shown in region B of FIG. 12).

The shift register according to the present invention is used for a scan driver to drive scan lines of a display device and a data driver to drive data lines As described above, stages within the shift register according to the second embodiment of the present invention may connect gate terminals of A and B fifth transistors T5A and T5B to the node P, arranged between the first and second transistors T1 and T2, to prevent high state output signals from deteriorating due to a leakage current at the fourth PMOS transistor T4. Further, the A and B fifth transistors T5A and T5B may be turned off by of the eighth transistor T8 during the periods of time when the fourth transistor T4 is turned on, thereby preventing low state output signals from deteriorating due to presence of the A and B fifth transistors T5A and T5B.

As described above, the shift register of the present invention may include stages capable of preventing output signals from deteriorating, thereby increasing reliability of the shift register.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A shift register, comprising a plurality of stages connected in cascade for shifting input signals in accordance with a plurality of phase-delayed control signals, a first supply voltage, and a second supply voltage, and for applying the shifted input signals as output signals and as input signals of the succeeding ones of stages, wherein each of plurality of stages comprises:
    a first controller for selectively applying an input signal and a first supply voltage to a first node arranged between first to third transistors that form a conductive path between a supply line of the input signal and an input line of the first supply voltage;
    a second controller for selectively applying the first supply voltage and the second supply voltage to a second node arranged between fourth and fifth transistors forming a conductive path between an input line of the second supply voltage and the input line of the first supply voltage; and
    an output buffer for selectively applying a predetermined control signal and the first supply voltage as an output signal to a stage output line sixth and seventh transistors forming a conductive path between the input line of the first supply voltage and an input line of the predetermined control signal,
    wherein the fifth transistor is controlled by a voltage of a third node arranged between the first and second transistors.

2. The shift register according to claim 1, wherein the first and second transistors include:
    first and second conductive paths, respectively, arranged between the supply line of the input signal and the first node; and
    first and second control electrodes, respectively, controlling respective ones of the first and second conductive paths in accordance with the input signal and a first control signal; and the third transistor includes:
    a third conductive path arranged between the first node and the input line of the first supply voltage; and
    a third control electrode controlling the third conductive path in accordance with a voltage present at the second node.

3. The shift register according to claim 2, wherein the fourth transistor includes:
    a fourth conductive path arranged between the input line of the second supply voltage and the second node; and
    a fourth control electrode controlling the fourth conductive path in accordance with a second control signal; and
the fifth transistor includes:
    a fifth conductive path arranged between the second node and the input line of the first supply voltage; and
    a fifth control electrode controlling the conductive path in accordance with the voltage of the third node arranged between the first and second transistors.

4. The shift register according to claim 3, wherein each stage further comprises an eighth transistor, wherein the eighth transistor turns the fifth transistor off when the fourth transistor is turned on.

5. The shift register according to claim 4, wherein the eighth transistor includes:
    an eighth conductive path arranged between the fifth control electrode of the fifth transistor and the input line of the first supply voltage; and
    an eighth control electrode controlling the eighth conductive path in accordance with the second control signal.

6. The shift register according to claim 3, wherein the sixth transistor includes a sixth conductive path arranged between an input line of a third control signal and a stage output line; and
    a sixth control electrode controlling the sixth conductive path in accordance with a voltage present at the first node; and
the seventh transistor includes:
    a seventh conductive path arranged between the stage output line and the input line of the first supply voltage; and
    a seventh control electrode controlling the seventh conductive path in accordance with a voltage present at the second node.

7. The shift register according to claim 6, further comprising a capacitor connected between the sixth control electrode and the stage output line.

8. The shift register according to claim 2, wherein the third transistor includes a dual gate transistor having control electrodes commonly connected to the second node.

9. The shift register according to claim 3, wherein the fifth transistor includes a dual gate transistor having control electrodes commonly connected to the third node.

10. The shift register according to claim 1, wherein transistors within each stage have the same channel type.

11. The shift register according to claim 1, wherein transistors within each stage include PMOS transistors.

12. The shift register according to claim 1, wherein transistors within each stage include NMOS transistors.

13. The shift register according to claim 1, wherein the second supply voltage is higher than the first supply voltage.

14. The shift register according to claim 13, wherein the first supply voltage is about 17V.

15. The shift register according to claim 13, wherein the second supply voltage is about −8V.

16. The shift register according to claim 6, wherein the first to third control signals comprise predetermined ones of three of four clock signals, wherein first to fourth ones of the four clock signals have sequentially delayed phases, wherein a predetermined voltage is associated with each phase.

17. The shift register according to claim 16, wherein a phase of the third control signal is delayed with respect to a phase of the first control signal by one clock.

18. The shift register according to claim 16, wherein a phase of the second control signal is delayed with respect to a phase of the third control signal by two clocks.

19. The shift register according to claim 16, a phase of a portion of the input signal is equal to a phase of the first control signal.

20. The shift register according to claim 1, wherein the shift register connected to a scan driver for driving scan lines of a display device.

21. The shift register according to claim 1, wherein the shift register connected to a data driver for driving data lines of the display device.

* * * * *